(12) United States Patent
Onuma (10) Patent No.: US 11,714,130 B2
(45) Date of Patent: Aug. 1, 2023

(54) ERROR RATE MEASURING APPARATUS AND ERROR DISTRIBUTION DISPLAY METHOD

(71) Applicant: ANRITSU CORPORATION, Kanagawa (JP)

(72) Inventor: Hiroyuki Onuma, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 15 days.

(21) Appl. No.: 17/552,608

(22) Filed: Dec. 16, 2021

(65) Prior Publication Data

US 2022/0283223 A1   Sep. 8, 2022

(30) Foreign Application Priority Data

Mar. 3, 2021 (JP) .................................. 2021-033606

(51) Int. Cl.
*G01R 31/3177* (2006.01)
*G01R 31/317* (2006.01)
*G06F 11/10* (2006.01)
*H04L 25/49* (2006.01)

(52) U.S. Cl.
CPC ... *G01R 31/3177* (2013.01); *G01R 31/31703* (2013.01); *G06F 11/10* (2013.01); *H04L 25/4917* (2013.01)

(58) Field of Classification Search
CPC .......... G01R 31/3177; G01R 31/31703; G01R 13/0227; G01R 31/3171; G06F 11/10; H04L 25/4917; H04L 1/0045; H04L 1/24
See application file for complete search history.

(56) References Cited

U.S. PATENT DOCUMENTS

2021/0126721 A1*   4/2021   Heinen .................. H04B 17/29

FOREIGN PATENT DOCUMENTS

JP          2007-274474 A      10/2007

* cited by examiner

*Primary Examiner* — Thien Nguyen
(74) *Attorney, Agent, or Firm* — Pearne & Gordon LLP (57) ABSTRACT

An error rate measuring apparatus that measures whether or not an FEC operation of the device under test is possible based on a comparison result of the signal received from the device under test and a test signal includes an operation unit that sets a codeword length and an FEC symbol length of the FEC corresponding to a communication standard of the device under test, a data comparison unit that compares bit string data obtained by converting the signal received from the device under test with error data to detect an FEC symbol error of each FEC symbol length, a display unit that associates the bit string data of the FEC symbol length as one point with one unit region of a display region and performs color-coding display depending on presence or absence of occurrence of the FEC symbol error by each FEC symbol length.

8 Claims, 8 Drawing Sheets

ERROR RATE MEASURING APPARATUS AND ERROR DISTRIBUTION DISPLAY METHOD

TECHNICAL FIELD

The present invention relates to an error rate measuring apparatus that transmits a known pattern (pulse amplitude modulation 4 (PAM4) signal) as a test signal to a device under test in a state in which the device under test has transited to a state of a signal pattern return and measures a bit error rate of input data returned and received from the device under test with the transmission of the test signal, and in particular, measures whether or not a forward error correction (FEC) operation of the device under test is possible, and an error distribution display method.

BACKGROUND ART

For example, as disclosed in Patent Document 1 described below, an error rate measuring apparatus is hitherto known as an apparatus that transmits a test signal of a known pattern including fixed data to a device under test and compares a signal under test returned and received from the device under test in compliance with the transmission of the test signal with a reference signal to be a reference in units of bits to measure a bit error rate (BER).

Incidentally, in a case where a PAM is particularly used as the test signal, while a large amount of transmission can be realized compared to non return to zero (NRZ), an Eye opening is small, and thus, a signal to noise ratio (SNR) is damaged compared to the NRZ. For this reason, as the number of symbols increases, the influence of noise also becomes large, and it is extremely difficult to make errors zero. Therefore, it is desirable to count FEC symbol errors that occur in a region corresponding to a communication standard of the device under test to be measured and to measure whether or not error correction based on forward error correction (FEC) is possible.

RELATED ART DOCUMENT

Patent Document

[Patent Document 1] JP-A-2007-274474

DISCLOSURE OF THE INVENTION

Problem that the Invention is to Solve

According to Patent Document 1 described above, it is possible to display a position of a bit error in a bit pattern string; however, it is not possible to recognize the occurrence or nonoccurrence of an error by each FEC symbol length.

That is, in a case where an error occurs in the device under test due to a specific input pattern, it is not possible to recognize where an error easily occurs and occurrences of an Uncorrectable codeword (a codeword on which forward error correction is impossible) of each codeword, and there is a problem in that debugging of the device under test cannot be efficiently performed.

Accordingly, the invention has been accomplished in view of the above-described problem, and an object of the invention is to provide an error rate measuring apparatus and an error distribution display method capable of confirming occurrences of FEC symbol errors.

Means for Solving the Problem

To achieve the above-described object, there is provided an error rate measuring apparatus 1 according to a first aspect of the invention that inputs an NRZ signal of a known pattern as a test signal to a device under test W, receives a signal from the device under test with the input of the test signal, and measures whether or not a forward error correction (FEC) operation of the device under test is possible based on a comparison result of the signal received from the device under test and the test signal. The error rate measuring apparatus includes an operation unit 4 that sets a codeword length and an FEC symbol length of the FEC corresponding to a communication standard of the device under test, a data comparison unit 3d that compares bit string data obtained by converting the signal received from the device under test with error data to detect an FEC symbol error of each FEC symbol length, and a display unit 6 that, based on a detection result of the data comparison unit, associates the bit string data of the FEC symbol length as one point with one unit region of a display region 22 and performs color-coding display depending on presence or absence of occurrence of the FEC symbol error by each FEC symbol length.

According to a second aspect of the invention, there is provided an error rate measuring apparatus 1 that inputs a PAM4 signal of a known pattern as a test signal to a device under test W, receives a signal from the device under test with the input of the test signal, and measures whether or not an FEC operation of the device under test is possible based on a comparison result of the signal received from the device under test and the test signal. The error rate measuring apparatus includes an operation unit 4 that sets a codeword length and an FEC symbol length of the FEC corresponding to a communication standard of the device under test, data division means 3da for dividing symbol string data obtained by converting the signal received from the device under test into most significant bit string data and least significant bit string data, a data comparison unit 3d that compares each of the most significant bit string data and the least significant bit string data divided by the data division means with error data to detect an FEC symbol error of each of the most significant bit string data and the least significant bit string data by each FEC symbol length, a display unit 6 that, based on a detection result of the data comparison unit, associates the most significant bit string data and the least significant bit string data of the FEC symbol length as one point with one unit region of a display region 22 and performs color-coding display depending on presence or absence of occurrence of the FEC symbol error by each FEC symbol length.

According to a third aspect of the invention, there is provided an error distribution display method for an error rate measuring apparatus 1 that inputs an NRZ signal of a known pattern as a test signal to a device under test W, receives a signal from the device under test with the input of the test signal, and measures whether or not an FEC operation of the device under test is possible based on a comparison result of the signal received from the device under test and the test signal. The error distribution display method includes a step of, at an operation unit 4 of the error rate measuring apparatus, setting a codeword length and an FEC symbol length of the FEC corresponding to a communication standard of the device under test, a step of, at a data comparison unit 3*d* of the error rate measuring apparatus, comparing bit string data obtained by converting the signal received from the device under test with error data to detect an FEC symbol error of each FEC symbol length, a step of, based on a detection result of the data comparison unit, associating the bit string data of the FEC symbol length as one point with one unit region of a display region 22 of a display unit 6 and performing color-coding display depending on presence or absence of occurrence of the FEC symbol error by each FEC symbol length.

According to a fourth aspect of the invention, there is provided an error distribution display method for an error rate measuring apparatus 1 that inputs a PAM4 signal of a known pattern as a test signal to a device under test W, receives a signal from the device under test with the input of the test signal, and measures whether or not an FEC operation of the device under test is possible based on a comparison result of the signal received from the device under test and the test signal. The error distribution display method includes a step of, at an operation unit 4 of the error rate measuring apparatus, setting a codeword length and an FEC symbol length of the FEC corresponding to a communication standard of the device under test, a step of, at data division means 3*da* of the error rate measuring apparatus, dividing symbol string data obtained by converting the signal received from the device under test into most significant bit string data and least significant bit string data, a step of, at a data comparison unit 3*d* of the error rate measuring apparatus, comparing each of the most significant bit string data and the least significant bit string data divided by the data division means with error data to detect an FEC symbol error of each of the most significant bit string data and the least significant bit string data by each FEC symbol length, and a step of, based on a detection result of the data comparison unit, associating the most significant bit string data and the least significant bit string data of the FEC symbol length as one point with one unit region of a display region 22 of a display unit 6 and performing color-coding display depending on presence or absence of occurrence of the FEC symbol error by each FEC symbol length.

Advantage of the Invention

According to the invention, in a case where an error occurs in the device under test due to a specific input pattern, it is possible to visually recognize where an error easily occurs and occurrences of an Uncorrectable codeword (a codeword on which forward error correction is impossible) of each codeword.

BEST MODE FOR CARRYING OUT THE INVENTION

Hereinafter, a mode for carrying out the invention will be described in detail referring to the accompanying drawings.

An error rate measuring apparatus according to the invention transmits a test signal of a known pattern to a device under test in a state in which the device under test has transited to a state of signal pattern return and measures an error rate of a received signal returned from the device under test in compliance with the transmission of the test signal.

Figure 1:
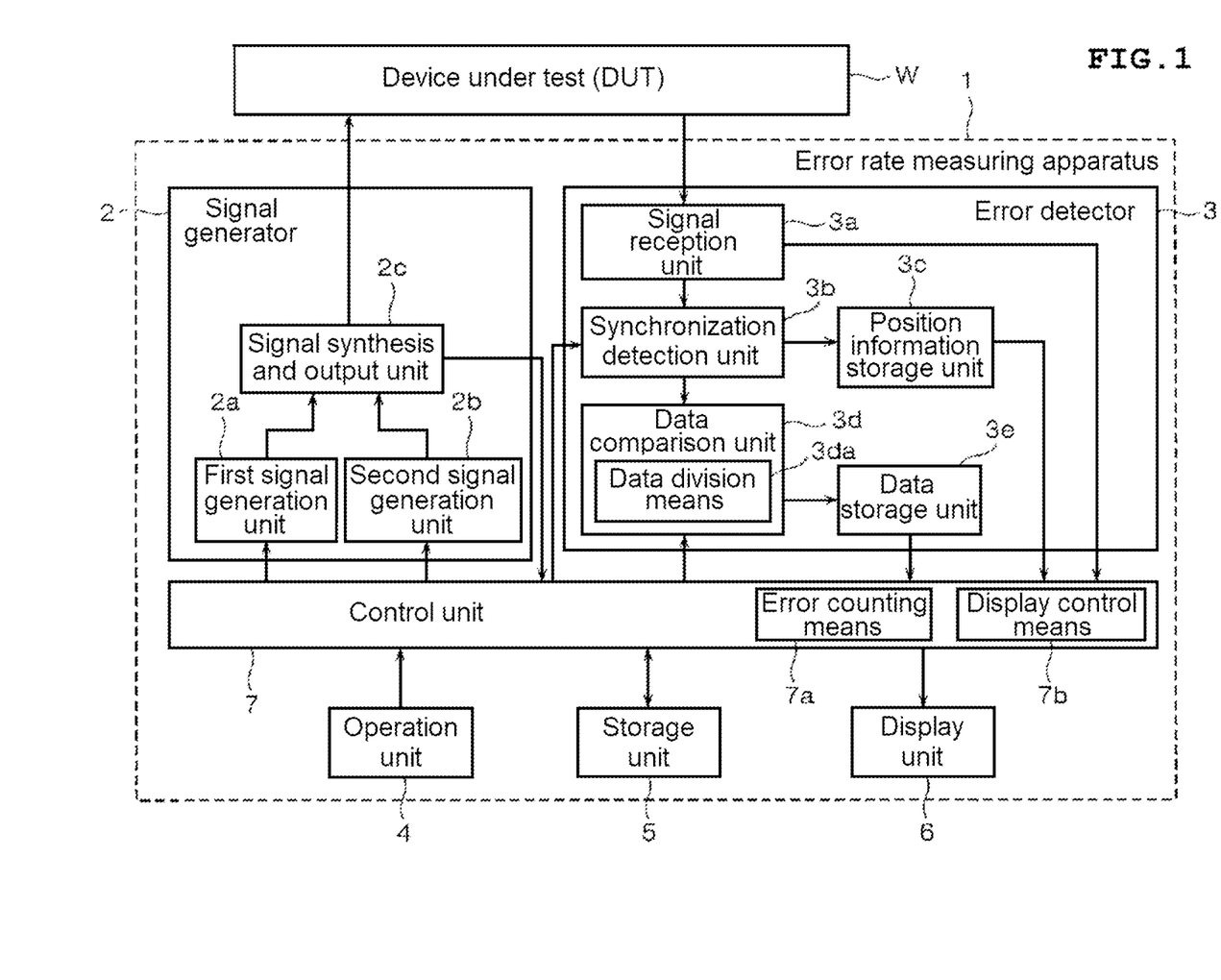
FIG. 1 is a block diagram showing the schematic configuration of an error rate measuring apparatus according to the invention.

As shown in FIG. 1, an error rate measuring apparatus 1 of an embodiment has a function of measuring whether or not a forward error correction (FEC) operation of a device under test W is possible based on a comparison result of a received signal from the device under test W when an NRZ signal of a known pattern with an inserted error or a PAM4 signal having four symbol values is input as a test signal to the device under test W, and the test signal, and schematically includes a signal generator 2, an error detector 3, an operation unit 4, a storage unit 5, a display unit 6, and a control unit 7.

In the embodiment, the configuration and processing content for realizing the function of measuring whether or not the FEC operation of the device under test W is possible is primarily described.

The signal generator 2 generates, as reference data based on a multi-value signal, an NRZ signal in a system in which there is no return to zero between bits or a PAM4 signal formed of desired symbol string data (data of a string of symbols having symbol values of 0, 1, 2, and 3).

In a case of generating the PAM4 signal, as shown in FIG. 1, the signal generator 2 schematically includes a first signal generation unit 2*a*, a second signal generation unit 2*b*, and a signal synthesis and output unit 2*c*.

Figure 2:
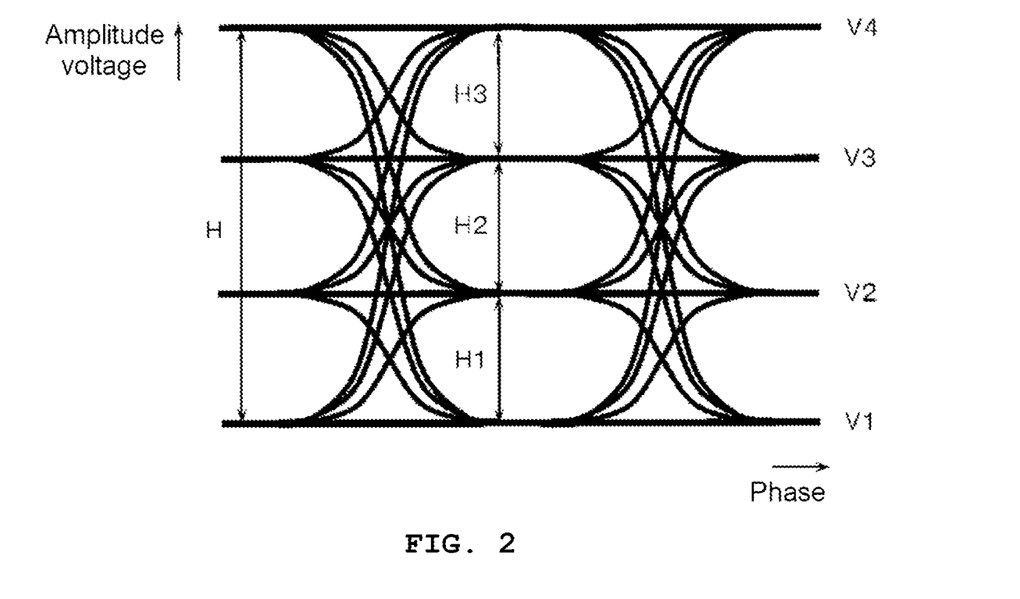
FIG. 2 is an explanatory view of a PAM4 signal.

The PAM4 signal has amplitude that is divided into four kinds for each symbol, and as shown in FIG. 2, has four different voltage levels V1, V2, V3, and V4 of amplitude. An entire amplitude voltage range H is divided into a low voltage range H1, a medium voltage range H2, and a high voltage range H3 in an ascending order of the voltage levels, and is formed of consecutive ranges based on three eye pattern openings.

Upon generating a desired PAM4 symbol string in a known pattern including fixed data, the first signal generation unit 2a generates a most significant bit (MSB) string signal that is added to a least significant bit (LSB) string signal to be generated by the second signal generation unit 2b to generate the PAM4 signal.

The second signal generation unit 2b generates the least significant bit string signal that is added to the most significant bit string signal generated by the first signal generation unit 2a to generate the PAM4 signal.

Examples of specific bit string signals that are generated by the first signal generation unit 2a and the second signal generation unit 2b include periodic patterns, such as various pseudo random patterns (Pseudo Random Bit Sequence (PRBS)) including PRBS7 (pattern length: $2^7-1$), PRBS9 (pattern length: $2^9-1$), PRBS10 (pattern length: $2^{10}-1$), PRBS11 (pattern length: $2^{11}-1$), PRBS15 (pattern length: $2^{15}-1$), and PRBS20 (pattern length: $2^{20}-1$), evaluation patterns for evaluating PAM including PRBS13Q, PRBS31Q, and SSPRQ, and a Reed-Solomon Forward Error Correction (RS-FEC) encoded scrambled idle pattern.

The signal synthesis and output unit 2c adds the most significant bit string signal generated by the first signal generation unit 2a and the least significant bit string signal generated by the second signal generation unit 2b to output the PAM4 signal. The PAM4 signal is input as a test signal of a known pattern to the device under test W in measuring an error rate or the like of the device under test W.

An error that is inserted into the test signal is optional. For example, any FEC symbol error is inserted in a case of checking FEC error tolerance of the device under test W. Furthermore, in a case of confirming tolerance of the device under test W, an error is inserted, and in a case where the device under test W confirms an error with any other test signals, an error is not inserted and confirmation is performed with a capture function.

The error detector 3 receives a signal to be output from the device under test W in compliance with the input of the NRZ signal or the PAM4 signal and measures the error rate or the like when the NRZ signal or the PAM4 signal to be reference data is input as the test signal of the known pattern from the signal generator 2 to the device under test W, and as shown in FIG. 1, includes a signal reception unit 3a, a synchronization detection unit 3b, a position information storage unit 3c, a data comparison unit 3d, and a data storage unit 3e.

In a case where the test signal input to the device under test W is the NRZ signal, the signal reception unit 3a samples the NRZ signal received from the device under test W in a predetermined sampling period to convert the signal into bit string data (data of a bit string having 0 and 1). The bit string data converted by the signal reception unit 3a is input to the synchronization detection unit 3b.

In a case where the test signal input to the device under test W is the PAM4 signal, the signal reception unit 3a samples the PAM4 signal received from the device under test W in a predetermined sampling period to convert the signal into symbol string data (data of a string of symbols having symbol values of 0, 1, 2, and 3). The symbol string data converted by the signal reception unit 3a is input to the synchronization detection unit 3b.

In a case where the test signal input to the device under test W is the NRZ signal, the synchronization detection unit 3b synchronously fetches the reference data that is data of the bit string of the NRZ signal to be a reference read from the storage unit 5 and the bit string data of the NRZ signal received from the device under test W and output from the signal reception unit 3a at a setting timing set in advance by the operation unit 4, and outputs the fetched bit string data to be input data to the data comparison unit 3d.

In a case where the test signal input to the device under test W is the PAM4 signal, the synchronization detection unit 3b synchronously fetches reference data that is data of the symbol string of the PAM4 signal to be a reference read from the storage unit 5 and the symbol string data of the PAM4 signal received from the device under test W and output from the signal reception unit 3a at a setting timing set in advance by the operation unit 4, and outputs the fetched symbol string data to be input data to the data comparison unit 3d.

The setting timing is set in advance by the operation unit 4, for example, on the setting screen (not shown) of the display unit 6, and is a timing at which a trigger signal is generated in response to a user's instruction, a timing at which a designated number of FEC symbol errors occur in one codeword length (for example, in a case where one codeword is 544 FEC symbols, and the user wants to capture at a timing at which 16 FEC symbol errors occur, synchronization is achieved at a timing at which 16/544 FEC symbol errors occur), or a timing at which a designated number of FEC symbol errors continuously occur (synchronization is achieved at a timing at which continuous FEC symbol errors occur by a number designated by the user, regardless of a codeword).

When synchronization is achieved, the synchronization detection unit 3b notifies the data comparison unit 3d that synchronization is achieved, and stores a synchronous position representing a position of a bit or a symbol in the reference data when synchronization is achieved, in the position information storage unit 3c.

When synchronization of the reference data and the bit string data of the NRZ signal or the symbol string data of the PAM4 signal from the signal reception unit 3a is achieved by the synchronization detection unit 3b, the position information storage unit 3c stores the synchronous position representing the position of the bit or the symbol in the reference data when synchronization is achieved.

In a case where the test signal input to the device under test W is the NRZ signal, the data comparison unit 3d captures the head of one FEC symbol (10 bits or 20 bits) of the bit string data fetched synchronously with the reference data (test signal) at the setting timing by the synchronization detection unit 3b and compares each bit with error data ("1") to detect bit errors of each one codeword length. That is, in a case where the bit of the bit string data is "1", this is detected as a bit error. The head of one FEC symbol of the bit string data is detected by making the counter of the data comparison unit 3d run free to assume the head.

In a case where the test signal input to the device under test W is the NRZ signal, the data comparison unit 3d divides the bit string data fetched synchronously with the reference data (test signal) at the setting timing by the synchronization detection unit 3b by each one FEC symbol length (10 bits or 20 bits) and detects FEC symbol errors at one FEC symbol interval. For example, in a case where one FEC symbol length is 10 bits, the bit string data is divided by 10 bits, and in a case where an error occurs even in one bit within 10 bits, this is detected as one FEC symbol error.

In a case where the test signal input to the device under test W is the PAM4 signal, the data comparison unit 3d captures the head of one FEC symbol (10 bits or 20 bits) of the symbol string data fetched synchronously with the reference data (test signal) at the setting timing by the synchronization detection unit 3b to divide the symbol string data into most significant bit string data (hereinafter, referred to as MSB data) and least significant bit string data (hereinafter, referred to as LSB data) by data division means 3*da*, and compares each of the MSB data and the LSB data with the error data ("1") to detect each of a most significant bit error (hereinafter, referred to as an MSB error) and a least significant bit error (hereinafter, referred to as an LSB error) of each one codeword length. That is, in a case where the divided MSB data is "1", this is detected and counted as an MSB error, and in a case where the divided LSB data is "1", this is detected as an LSB error. The head of one FEC symbol of the symbol string data is detected by making the counter of the data comparison unit 3*d* run free to assume the head.

In a case where the test signal input to the device under test W is the PAM4 signal, the data comparison unit 3*d* divides MSB data and LSB data by each one FEC symbol length (10 bits or 20 bits), and detects FEC symbol errors in each of the MSB data and the LSB data at one FEC symbol interval. For example, in a case where one FEC symbol length is 10 bits, the MSB data and the LSB data are divided by 10 bits, and in a case where an error occurs even in one bit within 10 bits, this is detected as one FEC symbol error.

In FIG. 1, for convenience of description, although a configuration in which the data comparison unit 3*d* includes the data division means 3*da* has been described, the data division means 3*da* can be configured of a known PAM decoder, for example.

The data storage unit 3*e* stores comparison result data of the data comparison unit 3*d*, or the like along with the bit string data or the symbol string data synchronized with the reference data.

The operation unit 4 also functions as setting means, and is configured of, for example, a user interface, such as an operation knob, various keys, switches, or buttons of the error rate measuring apparatus 1 of FIG. 1, or softkeys on a display screen of the display unit 6. The operation unit 4 executes various kinds of setting regarding an error rate measurement, such as setting of the setting timing, designation of a block of the bit string data or the symbol string data displayed on the display screen (the capture screen 6*a* of FIGS. 3A and 3B) of the display unit 6, setting of baud rate or generation conditions of a bit string or a symbol string, and an instruction to start or end the error rate measurement.

Figure 3A:
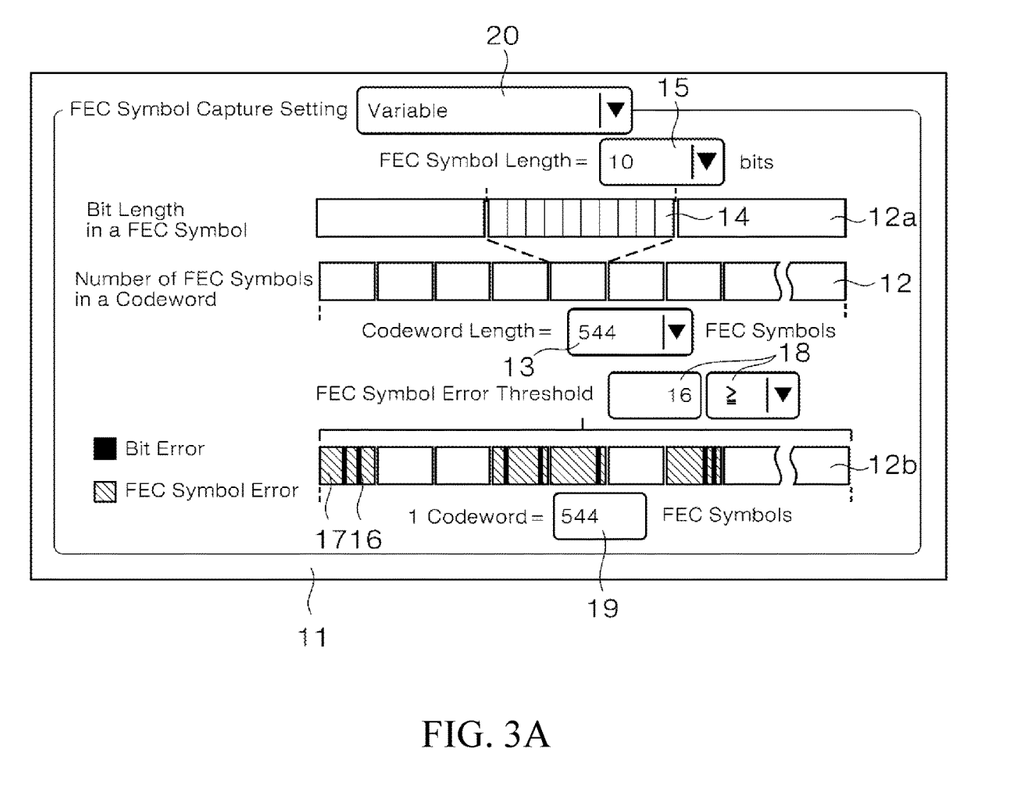
FIGS. 3A and 3B are diagrams showing an example of a setting screen of the error rate measuring apparatus according to the invention.

FIG. 3A shows an example of a setting screen 11 on which setting parameters (one codeword length, one FEC symbol length, and an FEC Symbol Error Threshold (a threshold value of FEC symbol errors for starting capture) of the FEC) to a signal received from the device under test W are set.

"FEC Symbol Error Threshold" as the threshold value is arbitrarily set as a value of a positive integer including zero by an operation of the operation unit 4. In performing FEC evaluation based on a communication standard, such as IEEE802.3ck, when the threshold value is set to "8" in a case where the test signal input to the device under test W is the NRZ signal, and the threshold value is set to "16" in a case where the test signal input to the device under test W is the PAM4 signal, it is possible to perform evaluation about whether or not the test signal input to the device under test W conforms to the communication standard.

On the setting screen 11 of FIG. 3A, as "Number of FEC Symbols in a Codeword" indicating the length of one codeword of the FEC, one codeword is displayed by, for example, a violet bar-shaped graphic 12 of which the length is partially omitted and which is sectioned by FEC symbols.

At a position directly below the graphic 12 of "Number of FEC Symbols in a Codeword", an input box 13 for selecting and setting the number of FEC symbols forming "Codeword Length" from a pull-down menu is displayed. The setting screen 11 of FIG. 3A shows a state in which "544" is selected and set in the input box 13.

At a position directly above the graphic 12 of "Number of FEC Symbols in a Codeword", "Bit Length in an FEC Symbol" that is indicated as forming a part of a codeword by a dotted line and is color-coded is displayed by a bar-shaped graphic 14. For example, color-coding display is performed in such a manner that the graphic 14 of the FEC Symbol is blue and portions corresponding to a graphic 12*a* of the Codeword except for the graphic 14 of the FEC Symbol are violet.

At a position directly above the graphic 14 of "Bit Length in an FEC Symbol", an input box 15 for selecting and setting the number of bits (10 bits or 20 bits) of "FEC Symbol Length" from a pull-down menu is displayed. The setting screen of FIG. 3A shows a state in which "10" is selected and set in the input box 15.

In addition, below the graphic 12 of "Number of FEC Symbols in a Codeword", as an error included in one codeword, a graphic 16 of "Bit Error" and a graphic 17 of "FEC Symbol Error" are color-coded and displayed in a graphic 12*b* of one Codeword. For example, color-coding display is performed in such a manner that the graphic 12*b* of one Codeword is violet, the graphic 16 of "Bit Error" is yellow, and the graphic 17 of "FEC Symbol Error" is red.

At a position directly above the graphic 12*b* of one Codeword where the graphic 16 of "Bit Error" and the graphic 17 of "FEC Symbol Error" are displayed, an input box 18 for setting a threshold value of "FEC Symbol Error Threshold" using an equality sign (=), an inequality sign with an equality sign (≥) and a numeral is displayed.

At a position directly below of the graphic 12*b* of one Codeword where the graphic 16 of "Bit Error" and the graphic 17 of "FEC Symbol Error" are displayed, an input box 19 for inputting the number of FEC symbols forming one codeword is displayed.

Figure 3B:
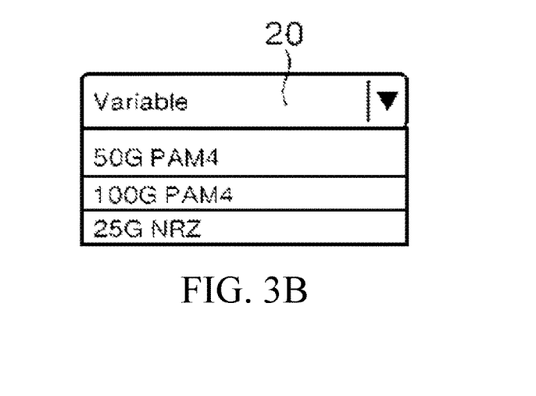

Then, in an upper portion of the setting screen 11 of FIG. 3A, a selection item 20 of "FEC Symbol Capture Setting" is displayed. As shown in FIG. 3B, in regard to the selection item 20 of "FEC Symbol Capture Setting", selection items of settings according to a communication standard are displayed in a pull-down menu. In an example of FIG. 3B, "Variable", "50G PAM4", "100G PAM4", and "25G NRZ" are displayed as selection items in a pull-down menu.

FIG. 3A shows a state in which "Variable" is selected as the selection item 20 of "FEC Symbol Capture Setting". In the state in which "Variable" is selected, it is possible to allow free selection and input to each input box from the pull-down menu.

In the example of FIG. 3A, "50G PAM4", "100G PAM4", and "25G NRZ" can be selected as the selection item 20 of a preset setting, and in a case where any preset setting is selected, respective parameters based on a communication standard of the selected preset setting is automatically set.

For example, in a case where "50G PAM4" is selected as the preset setting, the respective parameters are automatically set in such a manner that the codeword length is "544", the FEC symbol length is "10", and the FEC Symbol Error Threshold is "16".

In a case where "100G PAM4" is selected as the preset setting, the respective parameters are automatically set in such a manner that the codeword length is "272", the FEC symbol length is "20", and the FEC Symbol Error Threshold is "16".

In a case where "25G NRZ" is selected as the preset setting, the respective parameters are automatically set in such a manner that the codeword length is "528", the FEC symbol length is "10", and the FEC Symbol Error Threshold is "8".

In this way, on the setting screen 11 of FIG. 3A, a configuration relationship of the FEC symbol to one codeword and a correspondence relationship of the FEC symbol error to one codeword are graphically displayed in an identifiable manner. With this, it is possible to allow the user to set the respective parameters of the FEC to the signal received from the device under test W after visually recognizing the configuration relationship or the correspondence relationship of "Number of FEC Symbols in a Codeword", "Bit Length in an FEC Symbol", "Bit Error", and "FEC Symbol Error" even though the user is not an expert who knows the communication standard.

On the setting screen 11 of FIG. 3A, although a case where "Bit Length in an FEC Symbol", and "Bit Error" and "FEC Symbol Error" are vertically arranged centering on "Number of FEC Symbols in a Codeword" and are graphically displayed has been shown such that the configuration relationship of "Number of FEC Symbols in a Codeword", "Bit Length in an FEC Symbol", "Bit Error", and "FEC Symbol Error" is easily visually recognized, the invention is not limited to this arrangement. For example, "Bit Length in an FEC Symbol", and "Bit Error" and "FEC Symbol Error" may be reversely arranged or "Bit Length in an FEC Symbol", and "Bit Error" and "FEC Symbol Error" may be arranged above or below "Number of FEC Symbols in a Codeword" and may be graphically displayed.

The storage unit 5 stores a bit string of the NRZ signal or a symbol string of the PAM4 signal (a string of symbols having symbol values of 0, 1, 2, and 3) input to the device under test W as a test signal of a known pattern from the signal synthesis and output unit 2c. The bit string of the NRZ signal or the symbol string of the PAM4 signal input to the device under test W as the test signal of the known pattern is reference data to be a reference for comparison with input data that is generated from the signal received from the device under test W.

The storage unit 5 stores a counting result of error counting means 7a described below of the control unit 7. In addition, the storage unit 5 stores information regarding the setting timing, the baud rate, the generation conditions of the bit string or the symbol string, and the like. Such information can be appropriately selected and set by the operation unit 4 through the user interface.

A configuration may be made in which, in a case where the control unit 7 or the signal generator 2 can recognize the bit string of the NRZ signal or the symbol string of the PAM4 signal to be the test signal, the bit string of the NRZ signal or the symbol string of the PAM4 signal that is the test signal of the known pattern, that is, the reference data is stored from the control unit 7 or the signal generator 2 to the storage unit 5.

The display unit 6 is configured of, for example, a liquid crystal display or the like in the error rate measuring apparatus 1 of FIG. 1, and displays the setting screen regarding an error rate measurement, each compliance test (a test about whether or not the device under test W conforms to the communication standard) including the error rate measurement, the capture screen, and the like under the control of display control means 7b described below. The display unit 6 also has an operation function of the operation unit 4, such as softkeys on the display screen.

The display unit 6 displays an error map screen 21 in a display form shown in FIG. 5 or 6, for example, in addition to the setting screen 11 of FIG. 3A under the control of the display control means 7b described below.

Figure 5:
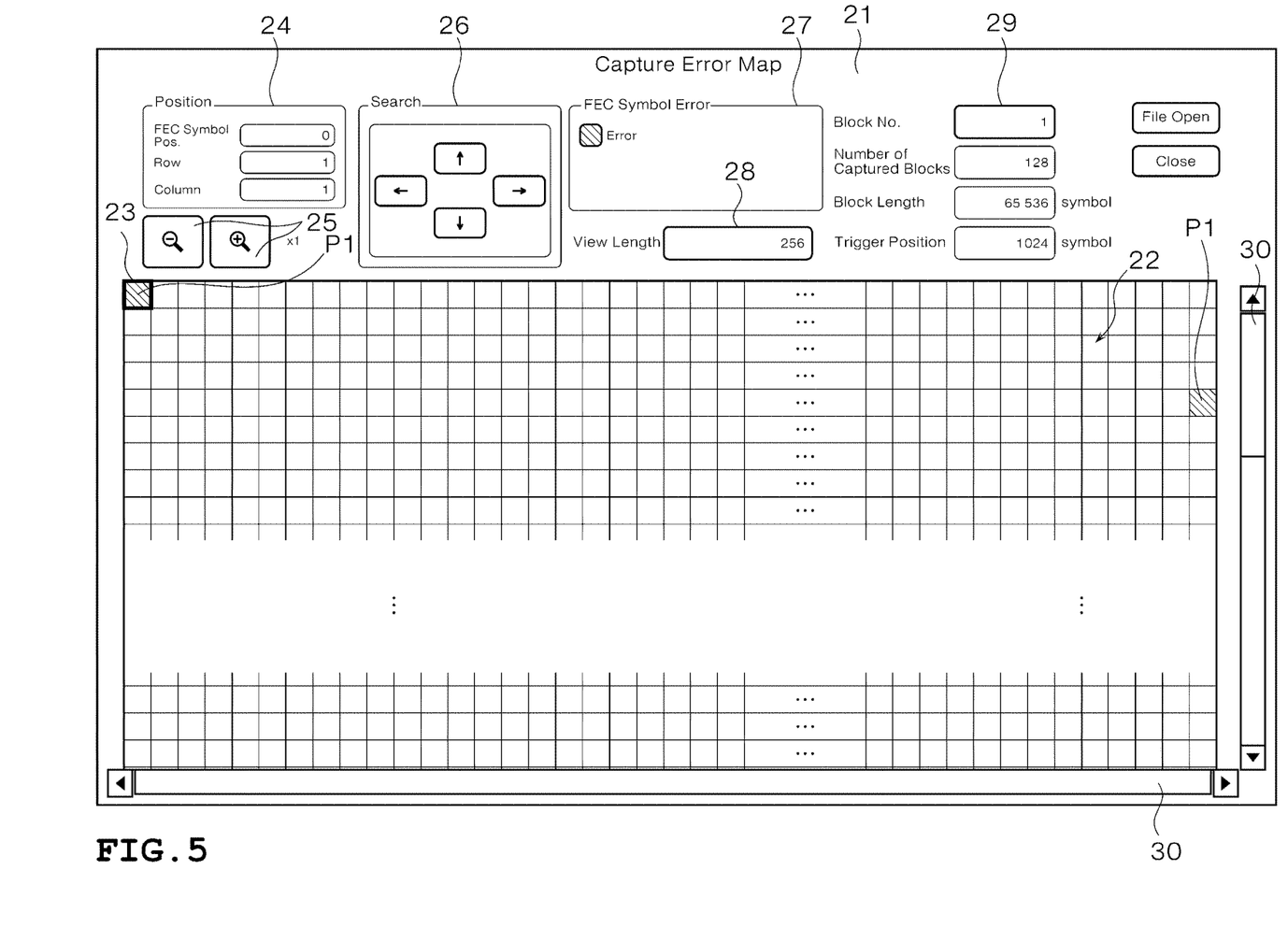
FIG. 5 is a diagram showing an example of an error map screen in a case where the NRZ signal is input to the device under test in the error rate measuring apparatus according to the invention.
Figure 6:
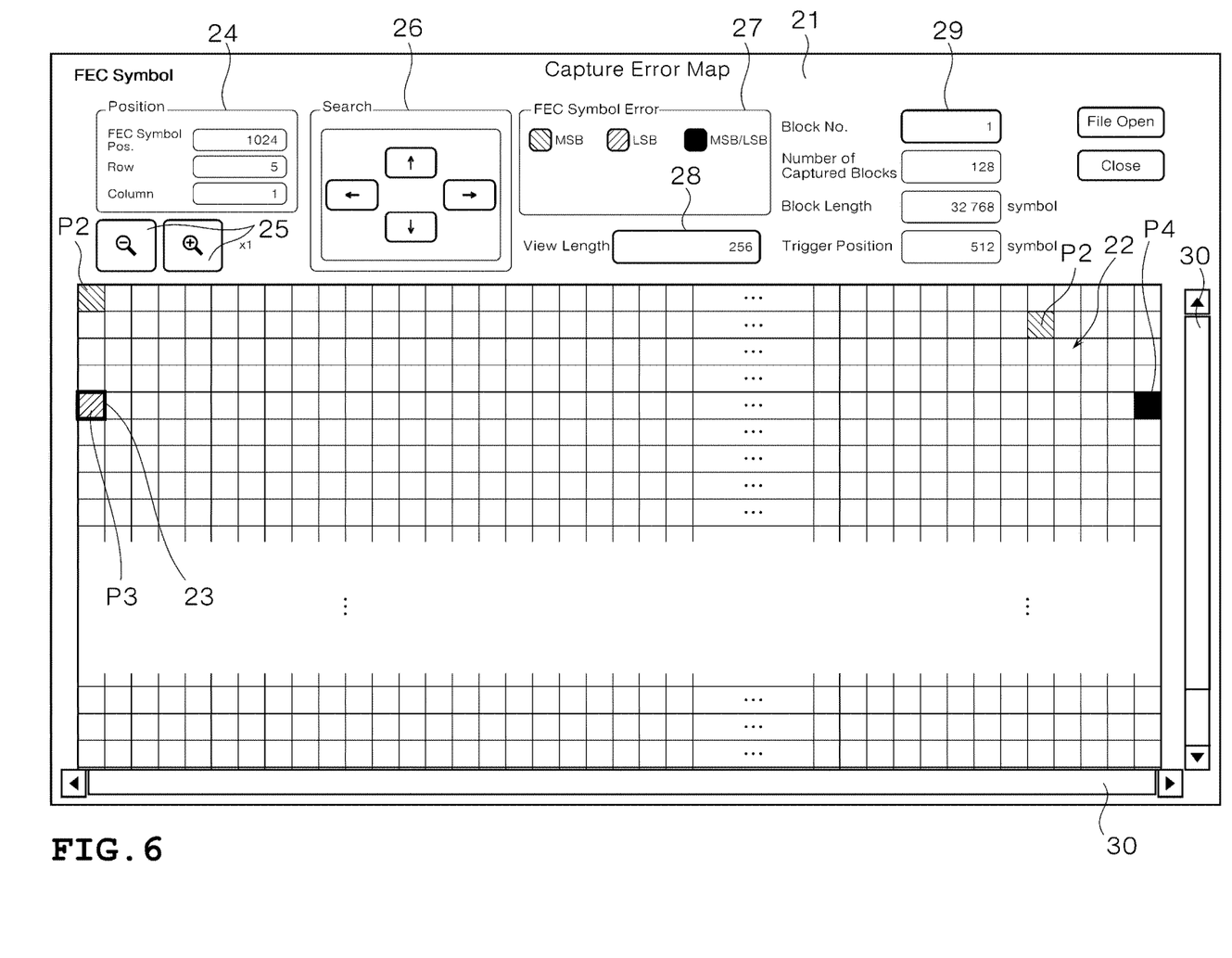
FIG. 6 is a diagram showing an example of an error map screen in a case where the PAM4 signal is input to the device under test in the error rate measuring apparatus according to the invention.

FIG. 5 or 6 shows an example of the error map screen 21 of the display unit 6. In a region of an upper left portion of the error map screen 21 of FIG. 5 or 6, "Position" 24 indicating position information of a cursor (a thick frame portion of a dot matrix) 23 on a display region 22 of a dot matrix is displayed. In "Position", "FEC Symbol Pos" indicating what number FEC Symbol is the position of the cursor 23, "Row" indicating a coordinate of the cursor 23 in a horizontal axis direction, and "Column" indicating a coordinate of the cursor 23 in a vertical axis direction are displayed. The error map screen 21 of FIG. 5 shows a state in which "FEC Symbol Pos" is "1024", "Row" is "5", and "Column" is "1".

In a region below "Position" 24, magnifier buttons 25 for enlarging and reducing a screen are disposed.

In a region on a right side of "Position" 24, "Search" 26 is displayed. In "Search" 26, four arrow keys of up, down, right, and left for moving the cursor 23 to a position with an FEC symbol error are disposed.

In a region on a right side of "Search" 26, "FEC Symbol Error" 27 is displayed. On the error map screen 21 of FIG. 5, in the display region 22 of the dot matrix, a location with an FEC symbol error is displayed as "Error" in red (right-downward oblique line), and a location with no FEC symbol error is displayed in sky blue. On the error map screen 21 of FIG. 6, in the display region 22 of the dot matrix, a location with an FEC symbol error in MSB data alone is displayed as "MSB" in red (right-downward oblique line), a location with an FEC symbol error in LSB data alone is displayed as "LSB" in yellow (right-upward oblique line), a location with an FEC symbol error in both MSB data and LSB data is displayed as "MSB/LSB" in green (blackened), and a location with no FEC symbol error is displayed in sky blue.

In a region below "FEC Symbol Error" 27, "View Length" is displayed. In "View Length", an input box 28 for inputting the number of dots in the horizontal axis of the display region 22 of the dot matrix is displayed. "256" is input to the input box 28 of "View Length" on the error map screen 21 of FIGS. 5 and 6, and this indicates that the horizontal axis of the display region 22 of the dot matrix is 256 dots.

In a region on a right side of "FEC Symbol Error" 27, "Block No", "Number of Captured Blocks", "Block Length", and "Trigger Position" are displayed. In "Block No", an input box 29 for inputting a block number of an FEC symbol captured and displayed in the display region 22 of the dot matrix of the error map screen 21 in a numerical value is displayed. In "Number of Captured Blocks", a block number captured and displayed in the display region 22 of the dot matrix of the error map screen 21 is displayed in a numerical value. In "Block Length", the number of symbols of a length of one block is displayed in a numerical value. In "Trigger Position", a symbol at a trigger position is displayed in a numerical value. For example, the error map screen 21 of FIG. 5 shows a state in which "1" is input to the input box 29 of "Block No", "128" is displayed in "Number of Captured Blocks", "65536" symbol is displayed in "Block Length", and "1024" symbol is displayed in "Trigger Position".

The display region 22 of the dot matrix of the error map screen 21 is color-coded and displayed depending on the presence or absence of occurrence of an FEC symbol error. In addition, in the display region 22 of the dot matrix, bit string data of an FEC symbol length is associated as one point with one dot of the display region 22 based on a detection result of the data comparison unit 3d, and color-coding display is performed depending on the presence or absence of occurrence of an FEC symbol error by each FEC symbol length. In the invention, one dot in the display region 22 of the dot matrix is defined as one unit region.

Figure 4A:
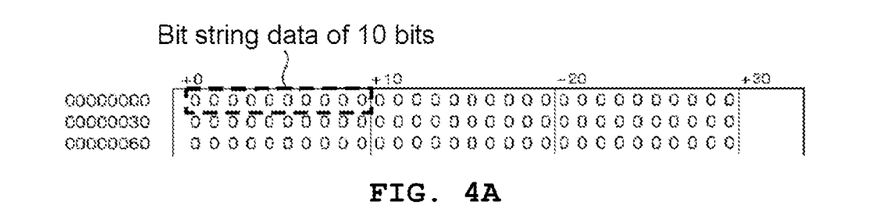
FIG. 4A is a diagram showing a part of a capture screen in a case where an NRZ signal is input to a device under test in the error rate measuring apparatus according to the invention.

For example, in a case where the test signal input to the device under test W is the NRZ signal and the FEC symbol length is 10 bits, bit string data of the FEC symbol length: 10 bits surrounded by a dotted line of FIG. 4A is associated as one point with one dot of the display region 22 on the error map screen 21 of FIG. 5, and color-coding display is performed such that a location (a right-downward oblique line portion of FIG. 5: P1) where an FEC symbol error occurs by 10 bits of the FEC symbol length is displayed in "red" and a location where no FEC symbol error occurs is displayed in "sky blue".

Figure 4B:
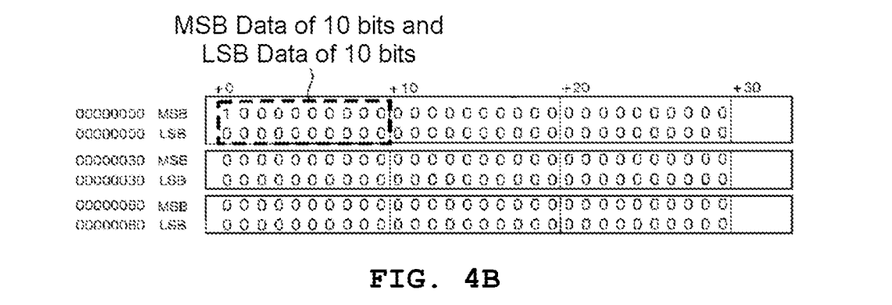
FIG. 4B is a diagram showing a part of a capture screen in a case where a PAM4 signal is input to the device under test in the error rate measuring apparatus according to the invention.

In a case where the test signal input to the device under test W is the PAM4 signal and the FEC symbol length is 10 bits, MSB data of the FEC symbol length: 10 bits and LSB data of the FEC symbol length: 10 bits surrounded by a dotted line of FIG. 4B are collectively associated as one point with one dot of the display region on the error map screen 21 of FIG. 6, and color-coding display is performed such that a location (a right-downward oblique line portion of FIG. 6: P2) where an FEC symbol error occurs in MSB data alone by 10 bits of the FEC symbol length is displayed in "red", a location (a right-upward oblique line portion of FIG. 6: P3) where an FEC symbol error occurs in LSB data alone is displayed in "yellow", a location (a blackened portion of FIG. 6: P4) where an FEC symbol error occurs in both MSB data and LSB data is displayed in "green", and a location where no FEC symbol error occurs is displayed in "sky blue".

Data that is not fully displayed in the display region 22 of the dot matrix can be displayed in the display region 22 using scroll bars 30 on a right side and a lower side and confirmed.

The control unit 7 is configured of a central processing unit (CPU) and a storage element, such as a read only memory (ROM) or a random access memory (RAM), to measure an error rate of the PAM4 signal, integrally controls the signal generator 2, the error detector 3, the operation unit 4, the storage unit 5, and the display unit 6, and includes the error counting means 7a and the display control means 7b.

In a case where the test signal input to the device under test W is the NRZ signal, the error counting means 7a performs counting (including counting codewords) of bit errors detected by the data comparison unit 3d, counting of FEC symbol errors detected at one FEC symbol interval, and counting of FEC symbol errors of each codeword length of the region sectioned at the codeword length. In regard to the FEC symbol errors of each codeword length, the error count of the FEC symbol errors less than the threshold value is counted individually and the error count of the FEC symbol errors equal to or greater than the threshold value is collectively counted.

In a case where the test signal input to the device under test W is the PAM4 signal, the error counting means 7a performs counting (including counting codewords) of the MSB errors and the LSB errors detected by the data comparison unit 3d, counting of the FEC symbol errors detected at one FEC symbol interval, and counting of the FEC symbol errors of MSB data+LSB data of each codeword length of the region sectioned at the codeword length. In regard to the FEC symbol errors of each codeword length, the error count of the FEC symbol errors less than the threshold value is counted individually and the error count of the FEC symbol errors equal to or greater than the threshold value is collectively counted.

The display control means 7b controls display on the display screen of the display unit 6, for example, the setting screen 11 of FIG. 3A or the error map screen 21 of FIG. 5 or 6.

Next, as a processing operation to display the error map screen 21 of the error rate measuring apparatus 1 configured as above, cases classified based on whether the test signal input to the device under test W is the NRZ signal or the PAM4 signal will be described referring to FIGS. 7 and 8.

[Case of NRZ Signal]

Figure 7:
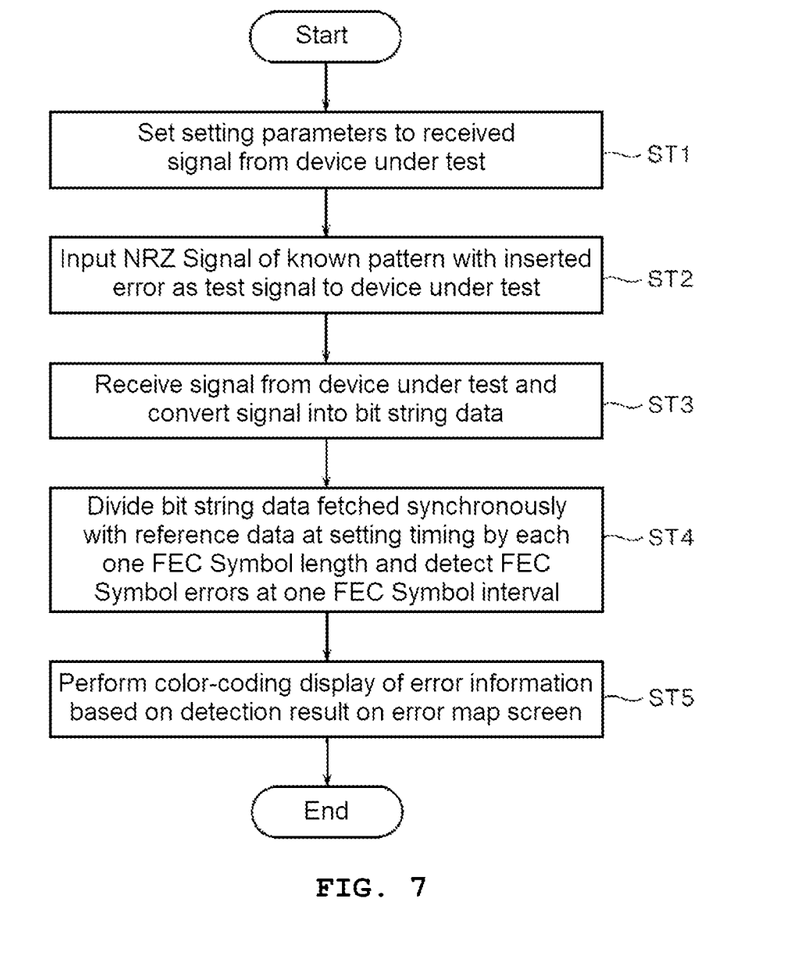
FIG. 7 is a flowchart of a processing operation until error map screen display in a case where the NRZ signal is input to the device under test in the error rate measuring apparatus according to the invention.

As shown in FIG. 7, first, the setting parameters to the received signal from the device under test W are set by the operation unit 4 (ST1). Specifically, on the setting screen 11 of FIG. 3A, one codeword length, one FEC symbol length, and the FEC Symbol Error Threshold are set based on the communication standard of the device under test W to be measured, or the preset setting (for example, 25G NRZ) corresponding to the communication standard is selected and set.

After the above-described setting ends, the NRZ signal (for example, 25G NRZ or the like conforming to the setting parameters) of the known pattern with an inserted error is input as the test signal to the device under test W by the signal generator 2 (ST2).

Then, a signal returned from the device under test W in compliance with the input of the test signal to the device under test W is received and converted into bit string data by the signal reception unit 3a (ST3).

Next, the head of one FEC symbol (10 bits or 20 bits) of the bit string data fetched synchronously with the reference data (test signal) at the setting timing by the synchronization detection unit 3b is captured, the bit string data is divided by each one FEC symbol length, and each bit is compared with the error data ("1") by the data comparison unit 3d to detect FEC symbol errors at one FEC symbol interval (ST4).

Then, in a case of confirming an occurrence distribution of the FEC symbol errors, color-coding display of the presence or absence of occurrence of an FEC symbol error is performed in the display region 22 of the dot matrix of the error map screen 21 of FIG. 5 under the control of the display control means 7b (ST5).

[Case of PAM4 Signal]

Figure 8:
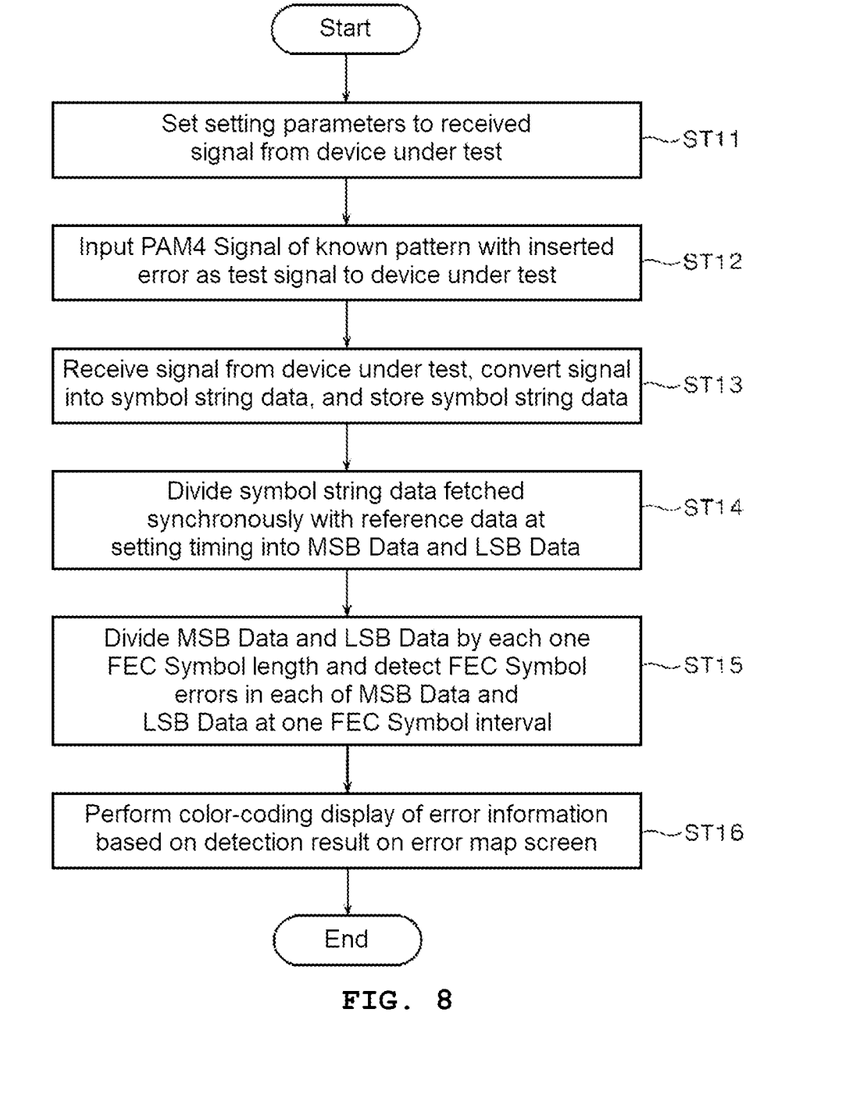
FIG. 8 is a flowchart of a processing operation until error map screen display in a case where the PAM4 signal is input to the device under test in the error rate measuring apparatus according to the invention.

As shown in FIG. 8, first, the setting parameters to the received signal from the device under test W are set by the operation unit 4 (ST11). Specifically, on the setting screen 11 of FIG. 3A, one codeword length, one FEC symbol length, and the FEC Symbol Error Threshold are set based on the communication standard of the device under test W to be measured or the preset setting (for example, 50G PAM4) corresponding to the communication standard is selected and set.

After the above-described setting ends, the PAM4 signal (for example, 50G PAM4 conforming to the setting parameters) of the known pattern with an inserted error is input as the test signal to the device under test W by the signal generator 2 (ST12).

Then, a signal returned from the device under test W in compliance with the input of the test signal to the device under test W is received and converted into symbol string data by the signal reception unit 3a (ST13).

Next, the head of one FEC symbol (10 bits or 20 bits) of the symbol string data fetched synchronously with the reference data (test signal) at the setting timing by the synchronization detection unit 3b is captured, and the symbol string data is divided into MSB data and LSB data by the data division means 3da (ST14).

Subsequently, the MSB data and the LSB data are divided by each one FEC symbol length, and each of the MSB data and the LSB data is compared with the error data ("1") by the data comparison unit 3d to detect FEC symbol errors in each of the MSB data and the LSB data at one FEC symbol interval (ST15).

Then, in a case of confirming an occurrence distribution of the FEC symbol errors, color-coding display of the presence or absence of occurrence of an FEC symbol error is performed in the display region 22 of the dot matrix of the error map screen 21 of FIG. 6 under the control of the display control means 7b (ST16).

Incidentally, in the above-described embodiment, as shown in FIG. 1, although a configuration is made in which the signal generator 2, the error detector 3, the operation unit 4, the storage unit 5, the display unit 6, and the control unit 7 are included in the error rate measuring apparatus 1, the invention is not limited to this configuration. For example, the signal generator 2 and the error detector 3 can also be separately modularized or housed in individual housings, and can also be configured of an external apparatus, such as a personal computer to which the operation unit 4 and the display unit 6 are externally connected.

In this way, according to the embodiment, in a case where an error occurs in the device under test due to a specific input pattern, it is possible to visually recognize where an error easily occurs and occurrences of an Uncorrectable codeword (a codeword on which forward error correction is impossible) of each codeword.

Although the best mode of the error rate measuring apparatus and the error distribution display method according to the invention has been described above, the invention is not limited by the description and the drawings according to this mode. That is, it is a matter of course that other modes, examples, operation techniques and the like made by those skilled in the art based on this mode are all included in the scope of the invention.

DESCRIPTION OF REFERENCE NUMERALS AND SIGNS 1 error rate measuring apparatus
2 signal generator
2a first signal generation unit
2b second signal generation unit
2c signal synthesis and output unit
3 error detector
3a signal reception unit
3b synchronization detection unit
3c position information storage unit
3d data comparison unit
3da data division means
3e data storage unit
4 operation unit
5 storage unit
6 display unit
7 control unit
7a error counting means
7b display control means
11 setting screen
12, 12a, 12b graphic of Codeword
13, 15, 18, 19 input box
14 graphic of FEC Symbol
16 graphic of Bit Error
17 graphic of FEC Symbol Error
20 selection item
21 error map screen
22 display region
23 cursor
25 magnifier button
28, 29 input box
30 scroll bar
P1 to P4 location of occurrence of FEC symbol error
W device under test

What is claimed is:

1. An error rate measuring apparatus that inputs a Non Return to Zero (NRZ) signal of a known pattern as a test signal to a device under test, receives a signal from the device under test with the input of the test signal, and measures whether or not a forward error correction (FEC) operation of the device under test is possible based on a comparison result of the signal received from the device under test and the test signal, the error rate measuring apparatus comprising:
a processor configured to:
set a codeword length and an FEC symbol length of the FEC corresponding to a communication standard of the device under test; and
compare bit string data obtained by converting the signal received from the device under test with error data to detect an FEC symbol error of each FEC symbol length; and
a display configured to, based on a detection result of the FEC symbol error, associate the bit string data of the FEC symbol length as one point with one unit region of a display region of the display, and perform color-coding display on the display depending on presence or absence of occurrence of the FEC symbol error by each FEC symbol length.

2. The error rate measuring apparatus according to claim 1, wherein the color-coding display color-codes and displays a location where the FEC symbol error occurs by each FEC symbol length and a location where the FEC symbol error does not occur by each FEC symbol length.

3. An error rate measuring apparatus that inputs a Pulse Amplitude Modulation 4 (PAM4) signal of a known pattern as a test signal to a device under test, receives a signal from the device under test with the input of the test signal, and measures whether or not a forward error correction (FEC) operation of the device under test is possible based on a comparison result of the signal received from the device under test and the test signal, the error rate measuring apparatus comprising:
a processor configured to:
that set a codeword length and an FEC symbol length of the FEC corresponding to a communication standard of the device under test;
divide symbol string data obtained by converting the signal received from the device under test into most significant bit string data and least significant bit string data; and
compare each of the most significant bit string data and the least significant bit string data divided by the data division means with error data to detect an FEC symbol error of each of the most significant bit string data and the least significant bit string data by each FEC symbol length; and
a display configured to, based on a detection result of the FEC symbol error, associate the most significant bit string data and the least significant bit string data of the FEC symbol length as one point with one unit region of a display region of the display and perform color-coding display on the display depending on presence or absence of occurrence of the FEC symbol error by each FEC symbol length.

4. The error rate measuring apparatus according to claim 3, wherein the color-coding display color-codes and displays a location where the FEC symbol error occurs in the most significant bit string data alone, a location where the FEC symbol error occurs in the least significant bit string data alone, a location where the FEC symbol error occurs in both the most significant bit string data and the least significant bit string data, and a location where the FEC symbol error does not occur.

5. An error distribution display method for an error rate measuring apparatus that inputs a Non Return to Zero (NRZ) signal of a known pattern as a test signal to a device under test, receives a signal from the device under test with the input of the test signal, and measures whether or not a forward error correction (FEC) operation of the device under test is possible based on a comparison result of the signal received from the device under test and the test signal, the error distribution display method comprising:
- a step of setting a codeword length and an FEC symbol length of the FEC corresponding to a communication standard of the device under test;
- a step of comparing bit string data obtained by converting the signal received from the device under test with error data to detect an FEC symbol error of each FEC symbol length; and
- a step of, based on a detection result of the FEC symbol error, associating the bit string data of the FEC symbol length as one point with one unit region of a display region of a display and performing color-coding display on the display depending on presence or absence of occurrence of the FEC symbol error by each FEC symbol length.

6. The error distribution display method according to claim 5, wherein the color-coding display color-codes and displays a location where the FEC symbol error occurs by each FEC symbol length and a location where the FEC symbol error does not occur by each FEC symbol length.

7. An error distribution display method for an error rate measuring apparatus that inputs a Pulse Amplitude Modulation 4 (PAM4) signal of a known pattern as a test signal to a device under test, receives a signal from the device under test with the input of the test signal, and measures whether or not a forward error correction (FEC) operation of the device under test is possible based on a comparison result of the signal received from the device under test and the test signal, the error distribution display method comprising:
- a step of setting a codeword length and an FEC symbol length of the FEC corresponding to a communication standard of the device under test;
- a step of dividing symbol string data obtained by converting the signal received from the device under test into most significant bit string data and least significant bit string data,
- a step of comparing each of the most significant bit string data and the least significant bit string data with error data to detect an FEC symbol error of each of the most significant bit string data and the least significant bit string data by each FEC symbol length; and
- a step of, based on a detection result of the FEC symbol error, associating the most significant bit string data and the least significant bit string data of the FEC symbol length as one point with one unit region of a display region of a display and performing color-coding display depending on presence or absence of occurrence of the FEC symbol error by each FEC symbol length.

8. The error distribution display method according to claim 7, wherein the color-coding display color-codes and displays a location where the FEC symbol error occurs in the most significant bit string data alone, a location where the FEC symbol error occurs in the least significant bit string data alone, a location where the FEC symbol error occurs in both the most significant bit string data and the least significant bit string data, and a location where the FEC symbol error does not occur.

* * * * *